United States Patent
Terada et al.

(10) Patent No.: US 11,967,061 B2
(45) Date of Patent: Apr. 23, 2024

(54) SEMICONDUCTOR APPARATUS EXAMINATION METHOD AND SEMICONDUCTOR APPARATUS EXAMINATION APPARATUS

(71) Applicant: HAMAMATSU PHOTONICS K.K., Hamamatsu (JP)

(72) Inventors: Hirotoshi Terada, Hamamatsu (JP); Yoshitaka Iwaki, Fujisawa (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 364 days.

(21) Appl. No.: 17/607,155

(22) PCT Filed: May 19, 2020

(86) PCT No.: PCT/JP2020/019811
§ 371 (c)(1),
(2) Date: Oct. 28, 2021

(87) PCT Pub. No.: WO2021/005892
PCT Pub. Date: Jan. 14, 2021

(65) Prior Publication Data
US 2022/0207710 A1    Jun. 30, 2022

(30) Foreign Application Priority Data

Jul. 10, 2019    (JP) ................ 2019-128344

(51) Int. Cl.
*G06V 10/00*    (2022.01)
*G06T 7/00*    (2017.01)
(Continued)

(52) U.S. Cl.
CPC .............. *G06T 7/0004* (2013.01); *G06T 7/70* (2017.01); *G06T 11/00* (2013.01); *G06T 2207/30148* (2013.01)

(58) Field of Classification Search
CPC ......... G06T 7/0004; G06T 7/70; G06T 11/00; G06T 2207/30148; G01N 21/956;
(Continued)

(56) References Cited

U.S. PATENT DOCUMENTS 5,796,118 A * 8/1998 Morikawa ............... B82Y 20/00
                                                                257/466
5,828,051 A * 10/1998 Goto ................... G06K 7/10653
                                                              235/472.01
(Continued)

FOREIGN PATENT DOCUMENTS

CN    102116838 A    7/2011
CN    107210244 A    9/2017
(Continued)

OTHER PUBLICATIONS

International Preliminary Report on Patentability dated Jan. 20, 2022 for PCT/JP2020/019811.

*Primary Examiner* — Amir Alavi
(74) *Attorney, Agent, or Firm* — Faegre Drinker Biddle & Reath LLP (57) ABSTRACT

A semiconductor apparatus examination method includes a step of detecting light from a plurality of positions in a semiconductor apparatus (D) and acquiring a waveform corresponding to each of the plurality of positions, a step of extracting a waveform corresponding to a specific timing from the waveform corresponding to each of the plurality of positions and generating an image corresponding to the specific timing based on the extracted waveform, and a step of extracting a feature point based on a brightness distribution correlation value in the image corresponding to the specific timing and identifying a position of a drive element in the semiconductor apparatus based on the feature point.

18 Claims, 9 Drawing Sheets

(51) Int. Cl.
*G06T 7/70* (2017.01)
*G06T 11/00* (2006.01)

(58) Field of Classification Search
CPC ........... G01N 21/8851; G01N 21/9501; G01N 2021/8854; G01N 2021/888; G01R 31/2656; G01R 31/26; G01R 31/2829; G01R 31/311
See application file for complete search history.

(56) References Cited

U.S. PATENT DOCUMENTS

| | | | | |
|---|---|---|---|---|
| 5,925,872 | A * | 7/1999 | Wyatt | G06K 7/10881 |
| | | | | 235/462.43 |
| 5,981,944 | A * | 11/1999 | Ito | H04N 1/207 |
| | | | | 358/463 |
| 6,055,251 | A * | 4/2000 | Ouchi | H01S 5/0687 |
| | | | | 372/28 |
| 6,246,099 | B1 * | 6/2001 | Pauchard | F23N 5/082 |
| | | | | 257/E31.032 |
| 6,501,775 | B2 * | 12/2002 | Taguchi | H01S 5/0683 |
| | | | | 372/29.015 |
| 6,703,598 | B2 * | 3/2004 | Muramatsu | H01L 31/0203 |
| | | | | 257/434 |
| 8,629,485 | B2 * | 1/2014 | Yamamura | H01L 31/103 |
| | | | | 257/291 |
| 10,910,503 | B1 * | 2/2021 | Bian | G02B 6/13 |
| 11,495,700 | B2 * | 11/2022 | Bian | G02B 6/1228 |
| 2002/0031248 | A1 | 3/2002 | Maed et al. | |
| 2004/0027149 | A1 | 2/2004 | Aitren et al. | |
| 2004/0141219 | A1 * | 7/2004 | Ono | G02B 26/123 |
| | | | | 359/204.4 |
| 2005/0024057 | A1 | 2/2005 | Desplats et al. | |
| 2005/0188290 | A1 | 8/2005 | Motika et al. | |
| 2005/0218921 | A1 | 10/2005 | Sanda et al. | |
| 2009/0150098 | A1 | 6/2009 | Khurana | |
| 2009/0295414 | A1 | 12/2009 | Falk | |
| 2014/0268152 | A1 | 9/2014 | Morrow et al. | |
| 2016/0238529 | A1 | 8/2016 | Sato | |

FOREIGN PATENT DOCUMENTS

| | | |
|---|---|---|
| JP | H05-152408 A | 6/1993 |
| JP | H10-150086 A | 6/1998 |
| JP | 2013-062281 A | 4/2013 |
| JP | 2013-083537 A | 5/2013 |
| TW | 201816408 A | 5/2018 |
| WO | WO-2004/053780 A1 | 6/2004 |
| WO | WO-2007/144970 A1 | 12/2007 |
| WO | WO 2010/070755 A1 | 6/2010 |
| WO | WO-2013/187200 A1 | 12/2013 |
| WO | WO 2016/140377 A1 | 9/2016 |

* cited by examiner

SEMICONDUCTOR APPARATUS EXAMINATION METHOD AND SEMICONDUCTOR APPARATUS EXAMINATION APPARATUS

TECHNICAL FIELD

One aspect of the present invention relates to a semiconductor apparatus examination method and a semiconductor apparatus examination apparatus.

BACKGROUND ART

Conventionally, an apparatus which examines a semiconductor apparatus examination apparatus while a test signal is applied thereto has been used. For example, in Patent Literature 1 below, an apparatus including a galvanometer mirror, two optical fibers, and a multifiber turret which can be optically coupled to them is known, in which one optical fiber is optically coupled to a laser scanning module and the other optical fiber is optically coupled to a single photon detector. In such an apparatus, it is possible to switch between examination of a semiconductor apparatus by LSM and light emission measurement by the single photon detector.

CITATION LIST

Patent Literature

[Patent Literature 1] U.S. Patent No. 2009/0295414

SUMMARY OF INVENTION

Technical Problem

Here, due to miniaturization of the semiconductor apparatus, interference (a mixture of light from a plurality of drive elements in the semiconductor apparatus) may occur in a detection signal. Positions of the drive elements cannot be properly identified from the detection signal in an interference state, and there is a possibility that examination such as a failure analysis of the semiconductor apparatus cannot be performed with high accuracy.

One aspect of the present invention has been made in view of the above-described circumstances, and relates to a semiconductor apparatus examination method and a semiconductor apparatus examination apparatus capable of improving the accuracy of semiconductor apparatus examination.

Solution to Problem

A semiconductor apparatus examination method according to one aspect of the present invention includes a step of detecting light from a plurality of positions in a semiconductor apparatus and acquiring a waveform corresponding to each of the plurality of positions, a step of extracting a waveform corresponding to a specific timing from the waveform corresponding to each of the plurality of positions and generating an image corresponding to the specific timing based on the extracted waveform, and a step of extracting a feature point based on a brightness distribution correlation value in the image corresponding to the specific timing and identifying a position of a drive element in the semiconductor apparatus based on the feature point.

In the semiconductor apparatus examination method according to one aspect of the present invention, the waveform corresponding to each of the plurality of positions is acquired based on light from the plurality of positions of the semiconductor apparatus, and the image corresponding to the specific timing is generated from a waveform corresponding to the specific timing extracted from each waveform. For example, an image associated with the operation of the drive element is generated by setting the specific timing as a timing related to the operation of the drive element. Then, a position having a high degree of relevance to the specific timing, that is, a position having a high degree of relevance to the operation of the drive element, is extracted as a feature point by extracting the feature point in consideration of the brightness distribution correlation value in the image corresponding to the specific timing, and the position of the drive element can be identified with high accuracy based on the feature point. It is possible to perform examination such as a failure analysis in the semiconductor apparatus with high accuracy by identifying the position of the drive element with high accuracy.

In the step of generating the image, a waveform corresponding to a specific timing related to an operation of the drive element may be extracted. Thus, a position having a high degree of relevance to the operation of the drive element can be appropriately extracted as a feature point, and the position of the drive element can be identified with high accuracy.

In the step of generating the image, a waveform corresponding to a specific timing based on design information of the semiconductor apparatus may be extracted. The operation timing of the drive element is identified by the design information of the semiconductor apparatus. Therefore, the waveform corresponding to the operation timing of the drive element can be appropriately acquired by extracting the waveform corresponding to the specific timing based on the design information of the semiconductor apparatus.

In the step of generating the image, a waveform may be extracted based on a correlation with the specific timing. For example, a waveform close to the operation timing of the drive element can be appropriately extracted by considering the correlation with the specific timing.

In the step of identifying the position, a center of gravity of the brightness distribution correlation value may be detected, and the feature point may be extracted based on the center of gravity. The position of the drive element can be identified with high accuracy by extracting the feature point based on the center of gravity of the brightness distribution correlation value.

In the step of identifying the position, fitting may be performed on the brightness distribution correlation value, and the feature point may be extracted based on fitting results. For example, the above-described center of gravity can be detected with high accuracy and the position of the drive element can be identified with high accuracy by applying Gaussian fitting or the like to the brightness distribution correlation value.

The above-described semiconductor apparatus examination method may further include a step of generating a measurement image by integrating the waveforms corresponding to the plurality of positions. Due to the measurement image being generated, a user can confirm a rough range of the detected light, and can confirm whether or not it is necessary to perform position identification (separation) processing of the drive element.

The above-described semiconductor apparatus examination method may further include a step of superimposing and displaying a position of the drive element identified in the identifying step on a pattern image showing a pattern of the semiconductor apparatus. Thus, it is possible to identify which drive element on the pattern image (a layout) has an abnormality.

In the step of acquiring the waveform, light emitted from the drive element may be detected as light from the plurality of positions in the semiconductor apparatus. Thus, it is possible to appropriately examine the light emission of the drive element.

A semiconductor apparatus examination apparatus according to one aspect of the present invention includes a photodetector configured to detect light from a plurality of positions in a semiconductor apparatus and to output a detection signal, an optical scanning part configured to guide light from the plurality of positions to the photodetector, and an analysis part configured to perform acquiring a waveform corresponding to each of the plurality of positions based on the detection signal, extracting a waveform corresponding to a specific timing from the waveform corresponding to each of the plurality of positions and generating an image corresponding to the specific timing based on the extracted waveform, and extracting a feature point based on a brightness distribution correlation value in the image corresponding to the specific timing and identifying a position of a drive element in the semiconductor apparatus based on the feature point.

The analysis part may extract a waveform corresponding to a specific timing related to an operation of the drive element.

The analysis part may extract a waveform corresponding to a specific timing based on design information of the semiconductor apparatus.

The analysis part may extract a waveform based on a correlation with the specific timing.

The analysis part may detect a center of gravity of the brightness distribution correlation value and may extract the feature point based on the center of gravity.

The analysis part may perform fitting on the brightness distribution correlation value, and may extract the feature point based on fitting results.

The analysis part may be configured to further perform generating a measurement image by integrating the waveforms corresponding to the plurality of positions.

The above-described semiconductor apparatus examination apparatus may further include a display part configured to superimpose and display a position of the drive element identified by the analysis part on a pattern image showing a pattern of the semiconductor apparatus.

The photodetector may detect light emitted from the drive element as light from the plurality of positions in the semiconductor apparatus.

Advantageous Effects of Invention

According to one aspect of the present invention, it is possible to improve accuracy of semiconductor apparatus examination.

DESCRIPTION OF EMBODIMENTS

Hereinafter, embodiments of a semiconductor examination apparatus according to the present invention will be described in detail with reference to the drawings. In each of the drawings, the same or corresponding parts are designated by the same reference numerals, and duplicate description will be omitted.

First Embodiment

Figure 1:
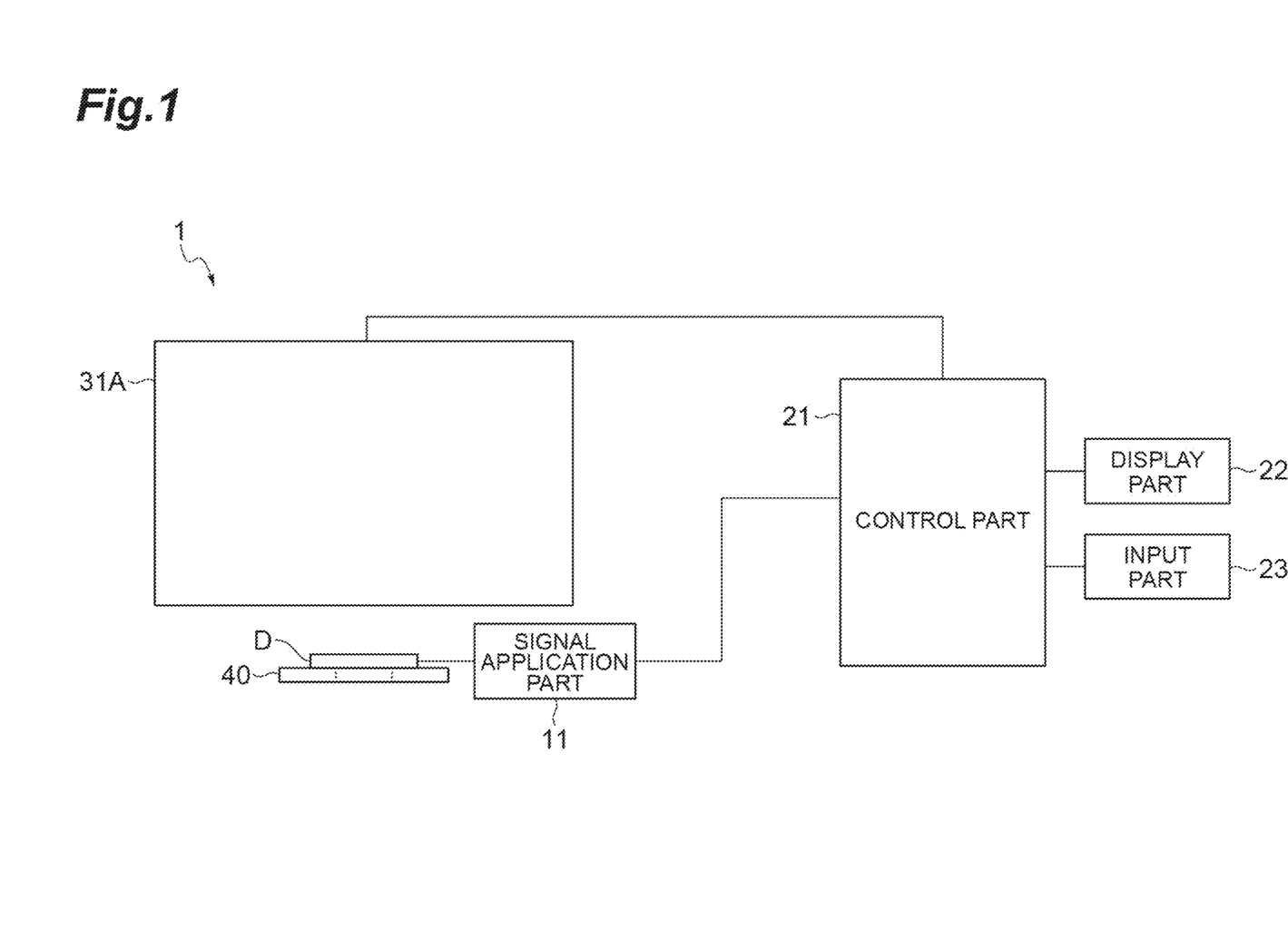
FIG. 1 is a configuration diagram of a semiconductor apparatus examination apparatus according to an embodiment of the present invention.

As shown in FIG. 1, the semiconductor apparatus examination apparatus 1 is a semiconductor apparatus examination apparatus for examining a semiconductor apparatus D, such as identifying a fault location in the semiconductor apparatus D which is a device under test (DUT). Further, the semiconductor apparatus examination apparatus 1 may perform a process of marking the fault location around the fault location, and the like, in addition to a process of identifying the fault location. With the marking, the fault location identified by the semiconductor apparatus examination apparatus 1 can be easily found in a subsequent process of a failure analysis.

The semiconductor apparatus D includes, for example, an individual (discrete) semiconductor element, an optoelectronic element, a sensor/actuator, a logic large scale integration (LSI), a memory element, a linear integrated circuit (IC), or a mixed apparatus thereof, and the like. Individual semiconductor elements include a diode, a power transistor, and the like. The logic LSI is configured of a transistor having a metal-oxide-semiconductor (MOS) structure, a transistor having a bipolar structure, or the like. Further, the semiconductor apparatus D may be a package including the semiconductor apparatus, a composite substrate, or the like. The semiconductor apparatus D is configured by forming a metal layer on a substrate. As the substrate of the semiconductor apparatus D, for example, a silicon substrate is used. The semiconductor apparatus D is placed on a sample stage 40.

The semiconductor apparatus examination apparatus 1 includes a signal application part 11, a control part 21 (an analysis part), a display part 22, an input part 23, and an optical apparatus 31A.

The signal application part 11 is electrically coupled to the semiconductor apparatus D via a cable, and applies a signal to the semiconductor apparatus D. The signal application part 11 is, for example, a tester unit which is operated by a power source (not shown) and repeatedly applies a signal such as a predetermined test pattern to the semiconductor apparatus D. The signal application part 11 is electrically coupled to the control part 21 via a cable, and applies a signal such as a test pattern designated by the control part 21 to the semiconductor apparatus D. The signal application part 11 does not necessarily have to be electrically coupled to the control part 21. When the signal application part 11 is not electrically coupled to the control part 21, the signal application part 11 determines a signal such as a test pattern by itself, and applies the signal such as the test pattern to the semiconductor apparatus D. The signal application part 11 may be a pulse generator which generates a predetermined signal and applies it to the semiconductor apparatus D.

The control part 21 is electrically coupled to an optical apparatus 31A via a cable. The control part 21 is a computer including, for example, a processor (a central processing unit (CPU)), and a random access memory (RAM), a read only memory (ROM), and a hard disk drive (HDD) which are storage media. The control part 21 performs processing by the processor on data stored in the storage medium. Further, the control part 21 may be configured of a microcomputer, a field-programmable gate array (FPGA), a cloud server, or the like. The control part 21 creates a pattern image or an analysis image (for example, a light emission image) based on a detection signal input from the optical apparatus 31A. The details of the control part 21 will be described later.

Further, the control part 21 outputs a created analysis image to the display part 22. The display part 22 is a display apparatus such as a display for showing the analysis image or the like to a user. The display part 22 displays the input analysis image. The display part 22 superimposes an analysis image (an image showing a light emission position of the drive element) on a pattern image showing an optical reflection pattern of the semiconductor apparatus D and displays it. The input part 23 is an input apparatus such as a keyboard or a mouse which receives an input from the user. The input part 23 is used to input an observation range and an observation mark for observing a portion which is a fault candidate in detail based on the pattern image and the analysis image. The control part 21, the display part 22, and the input part 23 may be smart apparatus terminals.

Figure 2:
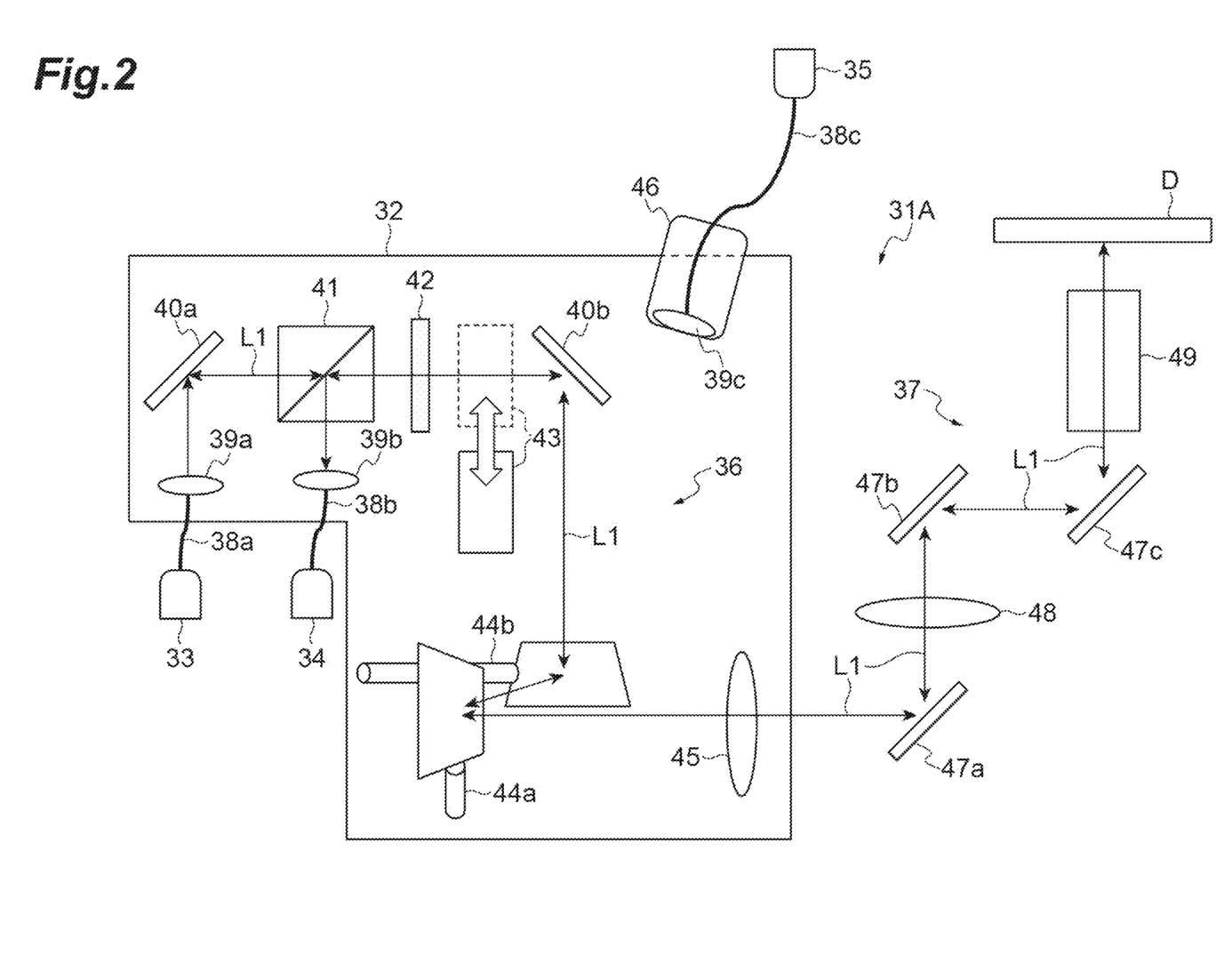
FIG. 2 is a diagram showing a configuration of an optical apparatus of FIG. 1 in a state in which it is switched to a first examination system and a first optical path.

Next, a configuration of the optical apparatus 31A will be described with reference to FIGS. 2 and 3. FIG. 2 is a diagram showing a configuration of the optical apparatus 31A in a state in which it is switched to a first examination system and a first optical path, and FIG. 3 is a diagram showing a configuration of the optical apparatus 31A in a state in which it is switched to a second examination system and a second optical path.

Figure 3:
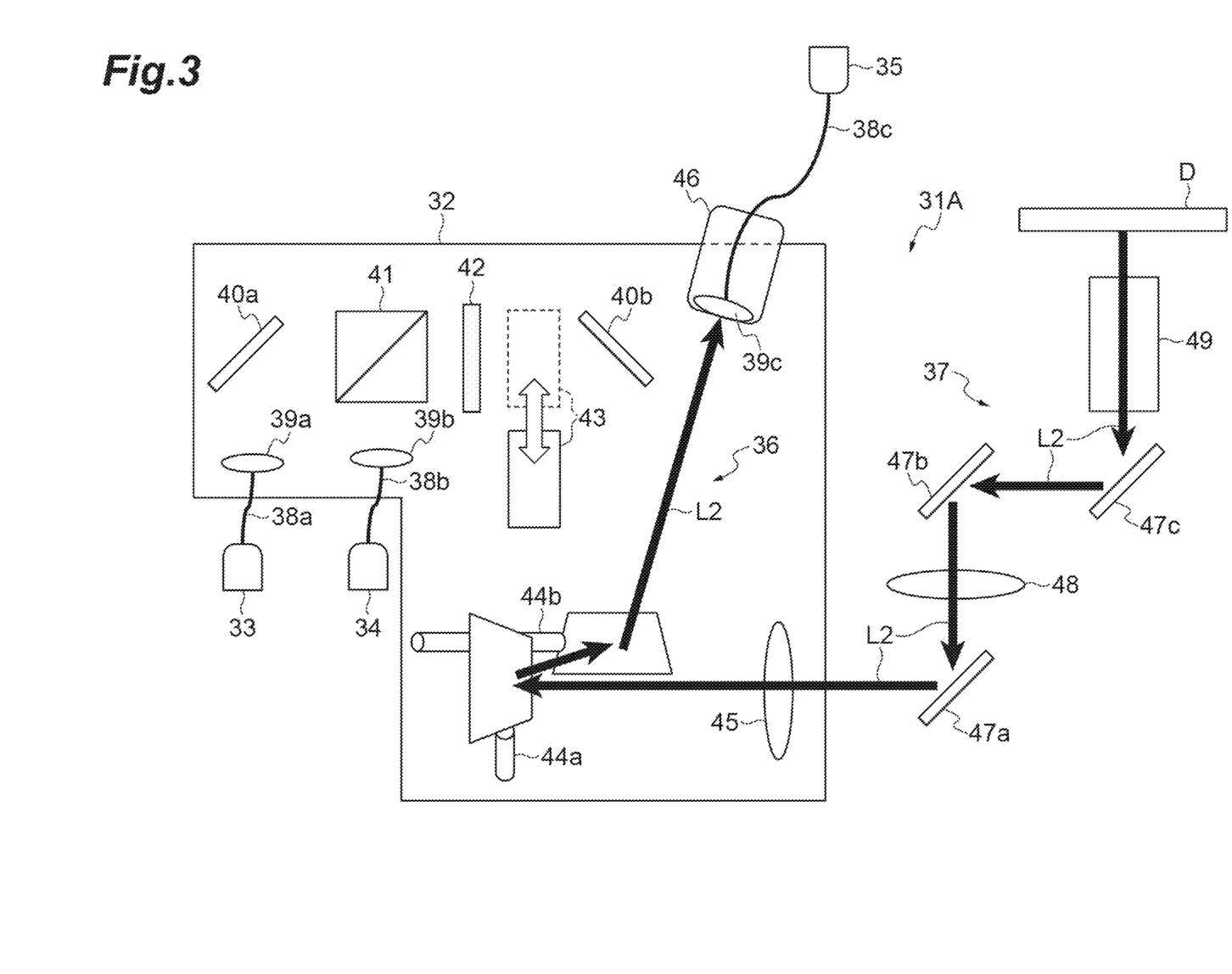
FIG. 3 is a diagram showing a configuration of the optical apparatus of FIG. 1 in a state in which it is switched to a second examination system and a second optical path.

As shown in FIGS. 2 and 3, the optical apparatus 31A includes a housing 32, a light source (a first light source) 33, a photodetector 34, a photodetector 35, an internal optical system 36 disposed inside the housing 32, and an external optical system 37 disposed outside the housing 32.

The light source 33 is operated by a power source (not shown) to generate light which illuminates the semiconductor apparatus D for generating a reflection image (a pattern image) of the semiconductor apparatus D. The light source 33 is an incoherent light source such as a light emission diode (LED) or super luminescent diode (SLD) light source. The light source 33 may be a coherent light source such as a laser light source. The light output from the light source 33 is radiated to the semiconductor apparatus D via the internal optical system 36 and the external optical system 37.

The photodetector 34 detects the reflected light from the semiconductor apparatus D and outputs a detection signal of the reflected light of the semiconductor apparatus D to the control part 21. For example, the photodetector 34 is a light receiving element such as a photomultiplier tube, a photodiode (PD), or an avalanche photodiode (APD). The reflected light from the semiconductor apparatus D is incident on the photodetector 34 via the external optical system 37 and the internal optical system 36.

When a signal such as a test pattern is applied to the semiconductor apparatus D, the photodetector 35 detects light (light emitted in the drive element) from a plurality of positions in the semiconductor apparatus D, and outputs a light emission detection signal of the semiconductor apparatus D to the control part 21. The photodetector 35 is, for example, a superconducting single photon detector (SSPD), a photomultiplier tube, an APD, a silicon photomultiplier (SiPM), or the like. Light from the semiconductor apparatus D is incident on the photodetector 35 via the external optical system 37 and the internal optical system 36.

The internal optical system 36 includes optical fibers 38a, 38b, and 38c, collimator lenses 39a, 39b, and 39c, a mirror 40a, a light guide element (a mirror) 40b, a polarization beam splitter (hereinafter referred to as "PBS") 41, a ¼ wave plate 42, a variable pupil 43, a pair of galvanometer mirrors 44a and 44b, and a pupil relay lens 45.

One-side ends of the optical fibers 38a, 38b, and 38c are optically coupled to the light source 33, the photodetector 34, and the photodetector 35 outside the housing 32, and the other-side ends of the optical fibers 38a, 38b, and 38c are optically coupled to the collimator lenses 39a, 39b, and 39c inside the housing 32. The collimator lens 39a converts light emitted from the light source 33 into parallel light, and the collimator lenses 39b and 39c convert the light incident on the photodetector 34 and the photodetector 35 into parallel light. In this way, optimum adjustment can be made according to a wavelength or a focus of the light from the semiconductor apparatus D by receiving the light from an optical scanning part that will be described later with the collimator lens independently for each of the optical fibers.

The mirror 40a is disposed on the light output side of the collimator lens 39a inside the housing 32, the PBS 41 is disposed on the light input side of the collimator lens 39b, and the mirror 40a, the PBS 41, the ¼ wave plate 42, the variable pupil 43, and the mirror 40b are arranged and disposed in a straight line in that order. The mirror 40a reflects the light output from the light source 33 toward the PBS 41. The PBS 41 transmits linearly polarized light of the light output from the light source 33 toward the mirror 40b, and the ¼ wave plate 42 converts the linearly polarized light into circularly polarized light and outputs the circularly polarized light toward the mirror 40b. Further, the ¼ wave plate 42 converts the reflected light from the semiconductor apparatus D which is incident from the mirror 40b side into linearly polarized light in a direction orthogonal to the linearly polarized light of the light output from the light source 33, and the PBS 41 reflects the linearly polarized light of the reflected light toward the photodetector 34. The variable pupil 43 is provided to be able to move in and out of an optical path between the mirror 40a and the mirror 40b, and is for changing a size of the pupil.

As described above, the mirror 40b is optically coupled to the light source 33 and the photodetector 34. Specifically, the mirror 40b reflects the light output from the light source 33 and guides the light toward the pair of galvanometer mirrors 44a and 44b which are optical scanning parts. At the same time, the mirror 40b receives the reflected light from the semiconductor apparatus D via the pair of galvanometer mirrors 44a and 44b, and causes the reflected light to be incident on the photodetector 34 via the variable pupil 43, the ¼ wave plate 42, the PBS 41, the collimator lens 39b, and the optical fiber 38b. Although the mirror is used as a light guide element in the present embodiment, an optical fiber or the like may be used as long as it is an optical element capable of guiding light between the light source 33 and/or the photodetector 34 and the pair of galvanometer mirrors 44a and 44b.

The pair of galvanometer mirrors 44a and 44b are configured to be optically connectable to the light source 33 and the photodetector 34 via the mirror 40b, and are optically coupled to the external optical system 37 via the pupil relay lens 45. That is, the pair of galvanometer mirrors 44a and 44b are optical scanning parts which are disposed in a direction in which the mirror 40b reflects the light from the light source 33 and can reflect the light while scanning with it two-dimensionally, and have, for example, a configuration in which two galvanometer mirrors of which a swing angle can be changed about a predetermined axis are combined. The pair of galvanometer mirrors 44a and 44b can two-dimensionally scan the semiconductor apparatus with the light radiated to the semiconductor apparatus D. In addition, the pair of galvanometer mirrors 44a and 44b can also guide the reflected light or light emitted at a predetermined point of the semiconductor apparatus D toward a predetermined position of the mirror 40b or the collimator lens 39c while selecting a position two-dimensionally. That is, the pair of galvanometer mirrors 44a and 44b are optical scanning parts which guide light from a plurality of positions on the semiconductor apparatus D toward the photodetector 34 or toward the photodetector 35. Here, the semiconductor apparatus D may be illuminated two-dimensionally by reflecting light from a separately prepared light source with one mirror in a state in which the pair of galvanometer mirrors 44a and 44b are stopped. The swing angles of the pair of galvanometer mirrors 44a and 44b may be configured to be controllable by the control part 21.

The collimator lens 39c is held inside the housing 32 by a mounting part 46 provided at a position on the housing 32 which can be optically coupled to the pair of galvanometer mirrors 44a and 44b. The mounting part 46 forms a tubular member and is a part for mounting an optical element such as a collimator lens inside the housing 32. The other-side end of the optical fiber 38c is optically coupled to the collimator lens 39c inside the mounting part 46.

The external optical system 37 includes mirrors 47a, 47b, and 47c, a pupil relay lens 48, and an objective lens unit 49. The external optical system 37 guides the light from the light source 33 and causes the light to be incident on the semiconductor apparatus D, and guides the reflected light and the light emitted in the semiconductor apparatus D and causes them to be incident on the internal optical system 36. That is, the light from the light source 33 which is incident from the internal optical system 36 is reflected by the mirror 47a, then passes through the pupil relay lens 48, is sequentially reflected by the mirrors 47b and 47c, and is then radiated to the semiconductor apparatus D through the objective lens unit 49. On the other hand, the reflected light or light emitted in the semiconductor apparatus D passes through the objective lens unit 49, is then sequentially reflected by the mirrors 47c and 47b, passes through the pupil relay lens 48, is reflected by the mirror 47a, and is incident on the internal optical system 36. Here, the objective lens unit 49 may be configured to have a plurality of objective lenses having different magnifications and to be switched by a turret.

The optical apparatus 31A having the above-described configuration can be controlled by the control part 21 to switch the optical path optically coupled to the semiconductor apparatus D. The control part 21 controls the swing angles of the pair of galvanometer mirrors 44a and 44b so that the optical path optically coupled to the semiconductor apparatus D is switched between a first optical path L1 (FIG. 2) including the external optical system 37, the pair of galvanometer mirrors 44a and 44b, and the internal optical system 36 via the mirror 40b and a second optical path L2 (FIG. 3) including the external optical system 37, the pair of galvanometer mirrors 44a and 44b, and the internal optical system 36 via the collimator lens 39c in the mounting part 46 by controlling the swing angles of the pair of galvanometer mirrors 44a and 44b. Specifically, the control part 21 switches the optical path to the first optical path L1 when the user instructs the performing of examination of the reflected light (acquisition of the pattern image) via the input part 23, and switches the optical path to the second optical path L2 when the user instructs the performing of examination of the light emission (acquisition and analysis of the signal image) via the input part 23. At the same time, the control part 21 controls the light radiated to the semiconductor apparatus D to two-dimensionally scan the semiconductor apparatus D by sequentially changing the swing angles of the pair of galvanometer mirrors 44a and 44b within a predetermined angle range, and controls the reflected light or light emitted at a predetermined point of the semiconductor apparatus D to select a position and to be guided to the selected position while scanning two-dimensionally. Hereinafter, the processing of the control part 21 related to the acquisition and analysis of the signal image will be described in detail.

The control part 21 is configured to perform acquiring a waveform corresponding to each of a plurality of positions in the semiconductor apparatus D based on the detection signal of the light emitted in the semiconductor apparatus D output by the photodetector (a step of acquiring a waveform), extracting a waveform corresponding to a specific timing from the waveform corresponding to each of the plurality of positions and generating an image corresponding to the specific timing based on the extracted waveform (a step of generating an image), and extracting a feature point based on a brightness distribution correlation value in the image corresponding to the specific timing and identifying the position of the drive element in the semiconductor apparatus D based on the feature point (a step of identifying a position of a drive element). Hereinafter, the processing of the control part 21 in each of the steps will be described.

In the step of acquiring the waveform, the control part 21 designates a test pattern for the signal application part 11 in which the fault location performs an abnormal operation. The test pattern is a loop-shaped pattern (a test loop) in which the drive element repeats the same operation. In the step of acquiring the waveform, the test loop is looped a plurality of times for each predetermined point (1 pixel) on the semiconductor apparatus D, the light emission signal (the detection signal) at each predetermined point is acquired while the control part 21 two-dimensionally scans the predetermined point in the semiconductor apparatus D, the waveform at each predetermined point is acquired, and a signal image which is the light emission image is acquired.

Figure 4:
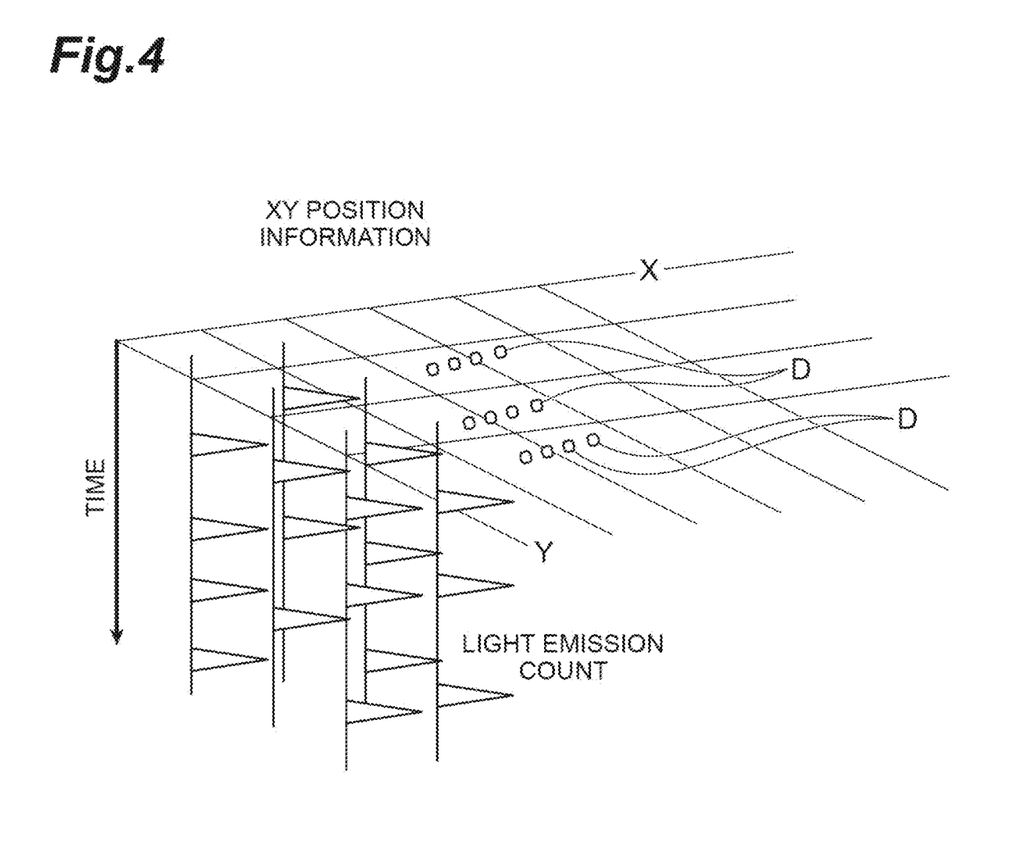
FIG. 4 is a diagram showing three-dimensional signal data.
Figure 6:
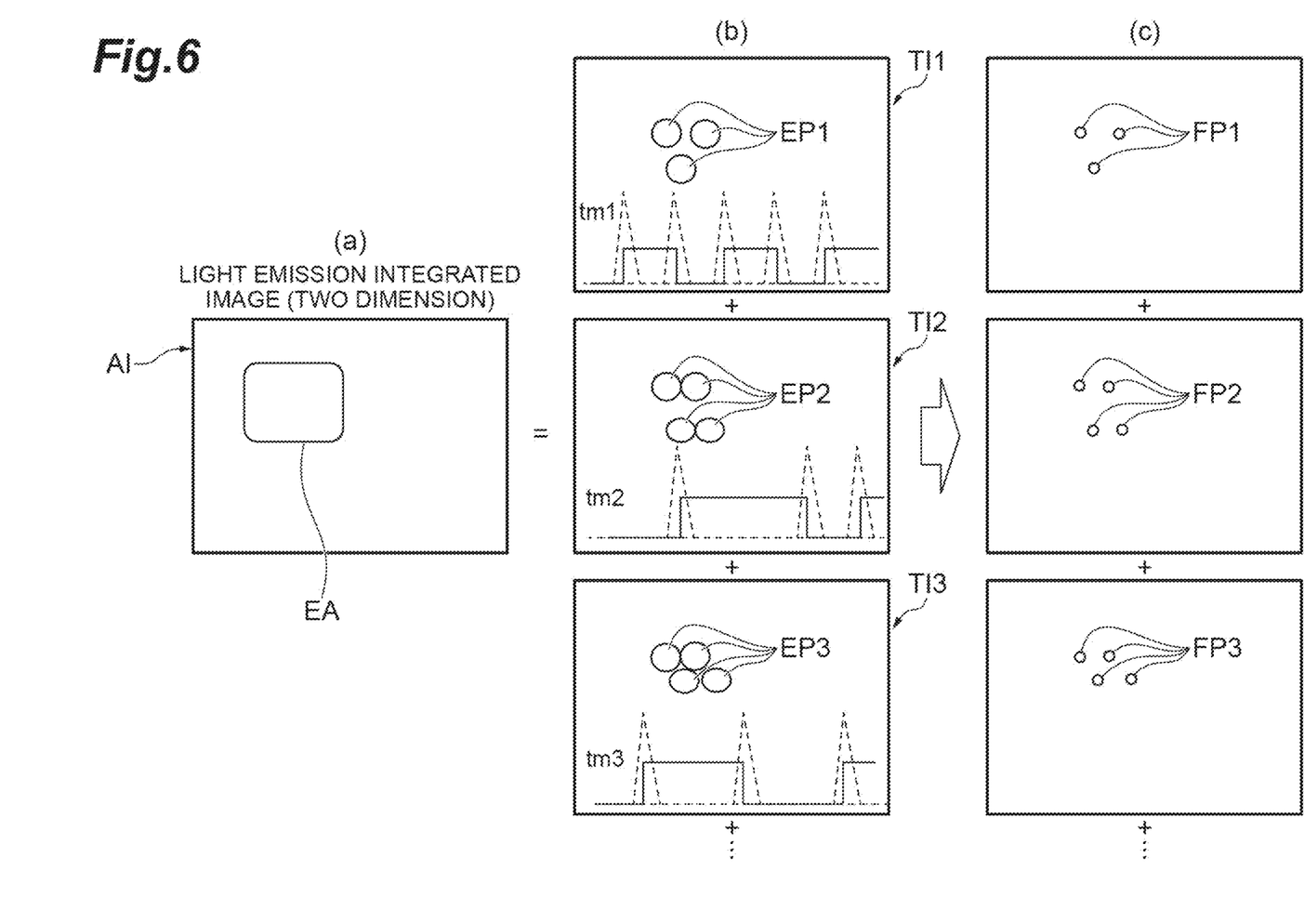
FIG. 6 is a diagram showing a signal analysis process.

Here, as described above, in the step of acquiring the waveform, the test loop is looped a plurality of times for each predetermined point in the semiconductor apparatus D, and the light emission pattern in a time axis direction is acquired. FIG. 4 is a diagram showing three-dimensional signal data. FIG. 4 shows an XY plane which is a light emission surface of the semiconductor apparatus D, and a time axis. A plurality of predetermined points D1 from which the light emission signals (the detection signals) are acquired are shown on the XY plane. Then, as shown in FIG. 4, the test loop is looped a plurality of times for each of the predetermined points D1 to acquire the light emission pattern in the time axis direction. The control part 21 generates a two-dimensional light emission integrated image AI (a measurement image) shown in FIG. 6(a) by integrating the waveforms corresponding to each of a plurality of positions (each of the predetermined points D1) in the time axis direction. In the light emission integrated image AI, the total count of light emission for each of the predetermined points D1 is displayed as a brightness level. As shown in FIG. 6(a), a light emission region EA is displayed separately in the light emission integrated image AI.

Figure 5:
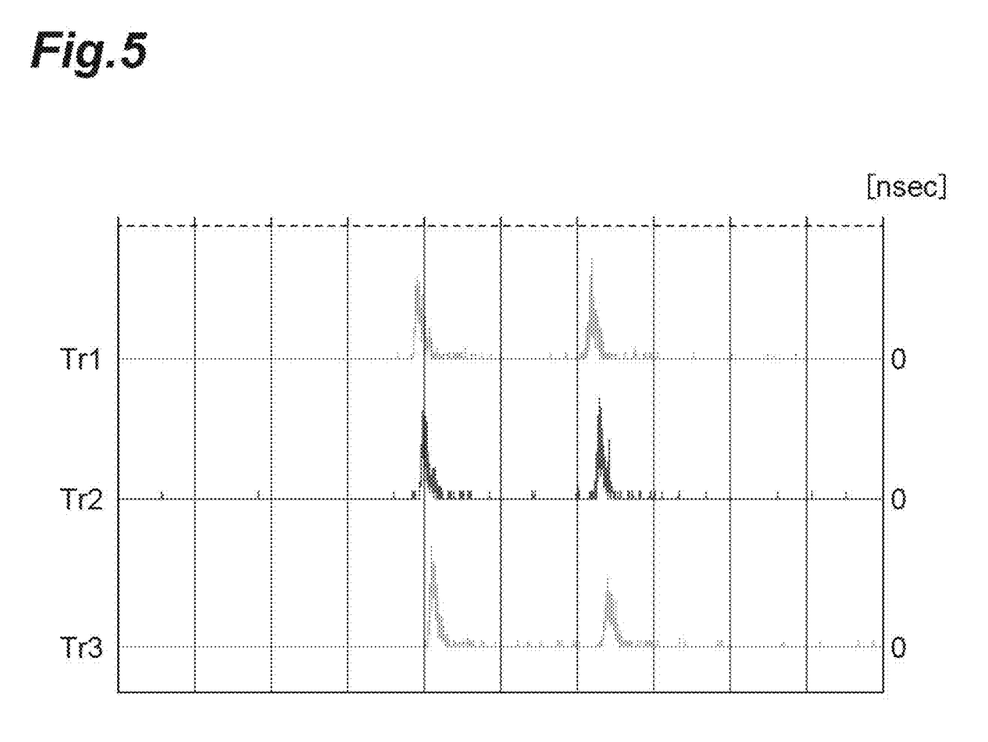
FIG. 5 is a diagram showing a signal time waveform of a drive element.

In the step of generating an image, the control part 21 extracts a waveform corresponding to a specific timing from the waveform corresponding to each of the predetermined points D1. When a chip of the drive element is smaller than optical resolution, interference of the light emission of a plurality of drive elements may occur in the detection signal. In this case, it is difficult to uniquely identify the drive element related to the detected light emission only from position information on the light emission surface (two-dimensional information on the XY plane shown in FIG. 4). At this point, the control part 21 uniquely identifies the drive element as will be described later by processing the signal three-dimensionally in consideration of a time waveform at each of the predetermined points D1. Specifically, the control part 21 extracts a waveform corresponding to a specific timing related to an operation of the drive element. FIG. 5 shows an example of the signal time waveforms of the drive elements Tr1, Tr2, and Tr3 of the semiconductor apparatus D. As shown in FIG. 5, switching timings (light emission timings) of the drive elements of the semiconductor apparatus D are different from each other. That is, in the example shown in FIG. 5, the drive element Tr1, the drive element Tr2, and the drive element Tr3 are operated in that order. The light emission pattern of each of the drive elements can be found in advance based on design information of the semiconductor apparatus D, simulation, and the like. The control part 21 identifies, for example, a specific timing related to the operation of the drive element based on the design information of the semiconductor apparatus D, and extracts a waveform corresponding to the specific timing. The control part 21 extracts a waveform based on, for example, a correlation with the specific timing.

In the example shown in FIG. 6(b), a waveform having a high correlation with a light emission timing tm1 of a first drive element, a waveform having a high correlation with a light emission timing tm2 of a second drive element and a waveform having a high correlation with a light emission timing tm3 of a third drive element are extracted from the waveforms corresponding to each of the predetermined points D1. Then, the control part 21 generates an image corresponding to a specific timing based on the extracted waveform. In the example shown in FIG. 6(b), an image TI1 corresponding to the light emission timing tm1 based on the waveform having a high correlation with the light emission timing tm1 of the first drive element, an image TI2 corresponding to the light emission timing tm2 based on the waveform having a high correlation with the light emission timing tm2 of the second drive element, and an image TI3 corresponding to the light emission timing tm3 based on a waveform having a high correlation with the light emission timing tm3 of the third drive element are generated. The light emission point EP1 corresponding to the light emission timing tm1 of the first drive element is shown in the image TI1, the light emission point EP2 corresponding to the light emission timing tm2 of the second drive element is shown in the image TI2, and the light emission point EP3 corresponding to the light emission timing tm3 of the third drive element is shown in the image TI3. For convenience of explanation, the signal waveforms of the respective emission timings tm1 to tm3 are shown to overlap (be superimposed on) the images TI1 to TI3 shown in FIG. 6(b), but such information is not actually displayed in the images TI1 to TI3.

Figure 7:
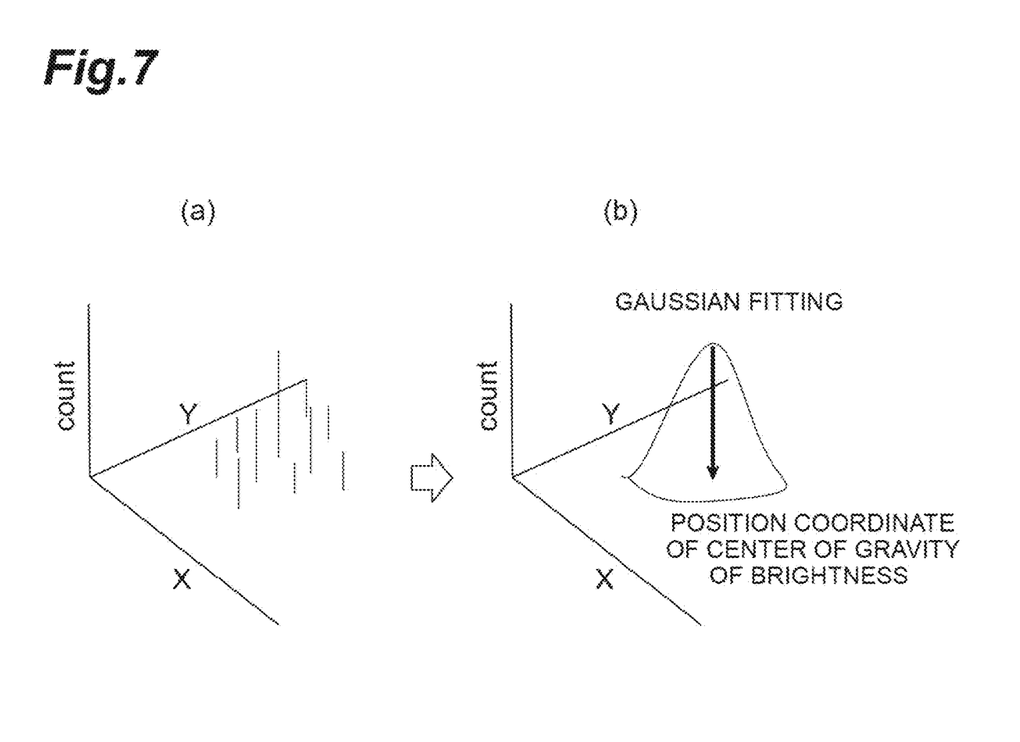
FIG. 7 is a diagram showing the signal analysis process.

In the step of identifying the position of the drive element, the control part 21 extracts feature points based on the brightness distribution correlation value in the image corresponding to a specific timing. That is, the control part 21 extracts feature points based on the brightness distribution correlation value for each of the light emission points EP1 of the image TI1 shown in FIG. 6(b), for example. FIG. 7(a) shows a brightness distribution correlation value for a certain light emission point. In FIG. 7(a), the XY plane shows the light emission surface. Further, a value (a count value) of a count axis orthogonal to the XY plane becomes higher as the light emission timing has a stronger correlation (a correlation of timing) with a specific timing. That is, a brightness value (a count value) in the brightness distribution correlation value shown in FIG. 7(a) is higher as the light emission timing is closer to the specific timing. The control part 21 detects, for example, the center of gravity of the brightness distribution correlation value and extracts the center of gravity as the feature point. The control part 21 performs fitting on the brightness distribution correlation value and extracts the feature point based on fitting results. As shown in FIG. 7(b), for example, the control part 21 may extract the center of gravity of the brightness distribution correlation value by applying Gaussian fitting to the brightness distribution correlation value, and may use the center of gravity as the feature point. In the example shown in FIGS. 6(b) and 6(c), a feature point FP1 corresponding to each of the light emission points EP1 is extracted based on the brightness distribution correlation value at each of the light emission points EP1 of the image TI1, a feature point FP2 corresponding to each of the light emission points EP2 is extracted based on the brightness distribution correlation value at each of the light emission points EP2 of the image TI2, and a feature point FP3 corresponding to each of the light emission points EP3 is extracted based on the brightness distribution correlation value at each of the light emission points EP3 of the image TI3. The control part 21 identifies each of the extracted feature points as a position of one of the drive elements.

When the separation of each of the drive elements (the identification of positions) is completed, the control part 21 outputs an analysis image (an image shown in FIG. 6(c)) in which the position of each of the drive elements is identified to the display part 22. As described above, the display part 22 superimposes and displays an analysis image showing the positions of the drive elements on the pattern image (the design layout) showing the pattern of the semiconductor apparatus D. It is possible to identify which drive element in the design layout is the drive element which does not emit light, the drive element which has a long light emission time, or the drive element which does not cause switching light emission by superimposing the analysis image on the pattern image, and thus a fault location can be identified. The display part 22 may superimpose the analysis image on the reflection image (the pattern image) acquired by scanning the semiconductor apparatus D with the light.

Next, processing related to a semiconductor apparatus examination method performed by the semiconductor apparatus examination apparatus 1 will be described with reference to FIGS. 8 and 9.

Figure 8:
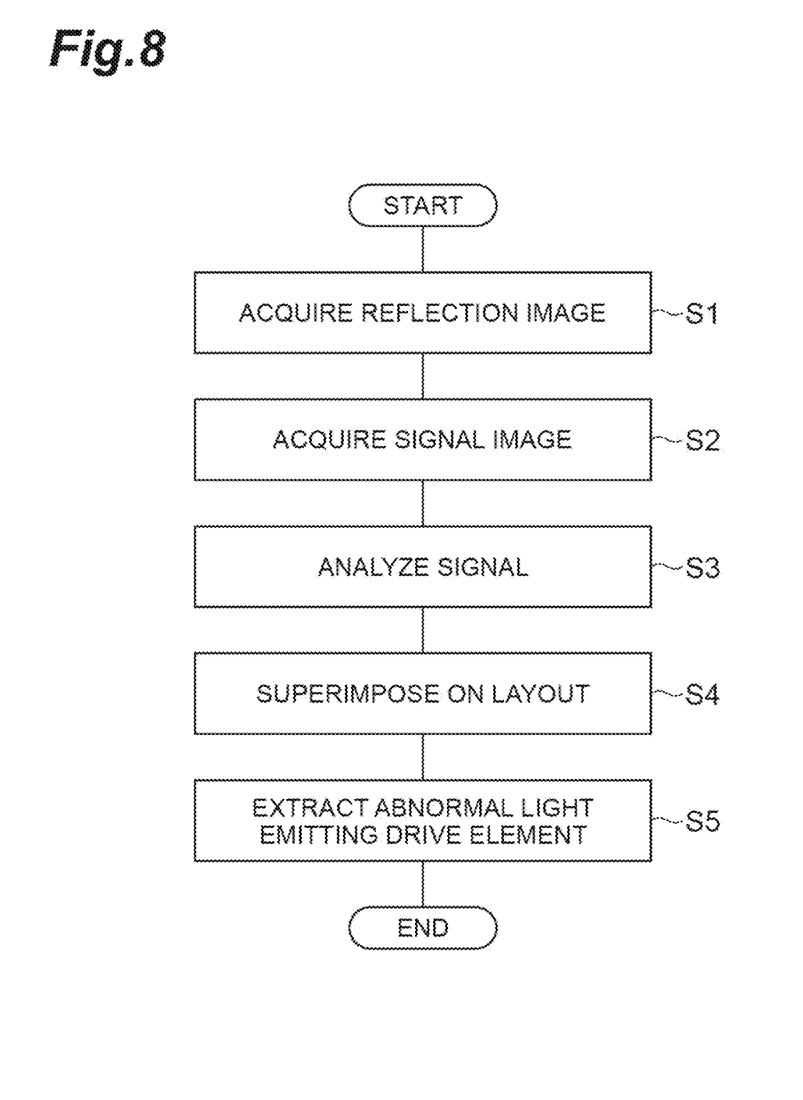
FIG. 8 is a flowchart showing a process related to a semiconductor apparatus examination method performed by a semiconductor apparatus examination apparatus.
Figure 9:
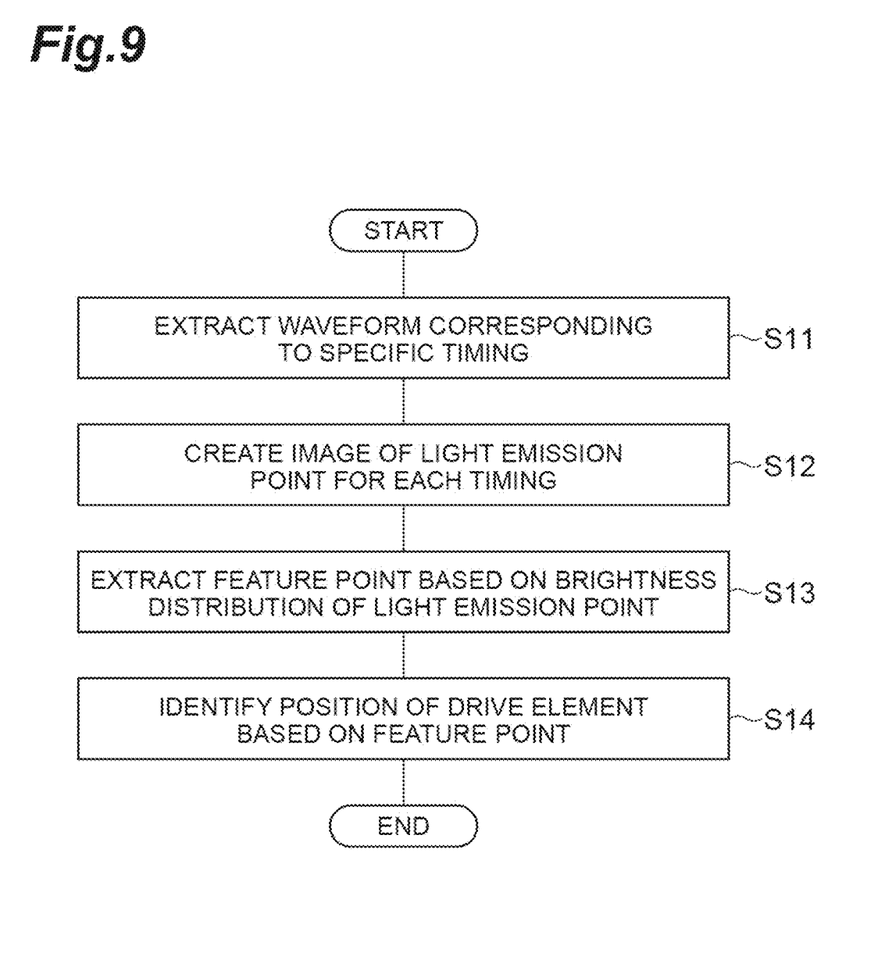
FIG. 9 is a flowchart showing the signal analysis process.

As shown in FIG. 8, first, a reflection image of a back surface of the semiconductor apparatus D is acquired (Step S1). When the user instructs to acquire the reflection image via the input part 23, the control part 21 switches to the first optical path shown in FIG. 2 to acquire the reflection image. The control part 21 acquires information on a region suspected of having a fault from, for example, diagnostic software, and acquires a reflection image of the region. In this case, the reflection image is acquired by fine sampling so that a pixel resolution is higher than an optical resolution. It is possible to appropriately focus on a desired position at which a failure analysis will be performed by acquiring the reflection image.

Subsequently, a signal image is acquired (Step S2). The control part 21 designates, with respect to the signal application part 11, that the fault location performs an abnormal operation. The control part 21 acquires a light emission signal (a detection signal) at each predetermined point while scanning the predetermined point (1 pixel) in the semiconductor apparatus D two-dimensionally so that a test loop is looped a plurality of times for each predetermined point of the semiconductor apparatus D, and acquires a signal image which is a two-dimensional light emission image by acquiring a waveform at each predetermined point.

Subsequently, the signal analysis is performed, and the position of the drive element is identified (Step S3). The details of Step S3 will be described later. Then, the display part 22 superimposes and displays an analysis image showing the position of the drive element on the pattern image (the design layout) showing the pattern of the semiconductor apparatus D (Step S4), and extracts an abnormal light emission drive element (Step S5).

Step S3 (the analysis of a signal) will be described in detail with reference to FIG. 9. As shown in FIG. 9, in signal analysis processing, first, a waveform corresponding to a specific timing is extracted (Step S11). The control part 21 identifies a specific timing related to the operation of the drive element based on design information of the semiconductor apparatus D, and extracts a waveform corresponding to the specific timing.

Subsequently, an image of a light emission point related to each timing is generated (Step S12). The control part 21 generates, for example, an image showing a light emission point having a high correlation with a light emission timing of each of the drive elements.

Subsequently, the feature point is extracted based on the brightness distribution correlation value of the light emission point (Step S13). The control part 21 extracts the feature point based on the brightness distribution correlation value in the image corresponding to a specific timing. The control part 21 performs fitting on the brightness distribution correlation value, and extracts the feature point based on the fitting result. As shown in FIG. 7(b), for example, the control part 21 may extract the center of gravity of the brightness distribution correlation value by applying Gaussian fitting to the brightness distribution correlation value, and may use the center of gravity as the feature point.

Finally, the position of the drive element is identified based on the extracted feature point. For example, the control part 21 may use the center of gravity of the extracted brightness distribution correlation value as the feature point and may identify a position of the feature point as the position of the drive element.

Next, the effects of the semiconductor apparatus examination apparatus 1 and the semiconductor apparatus examination method according to the embodiment will be described.

The semiconductor apparatus examination method according to the present embodiment includes a step of detecting light from a plurality of positions in the semiconductor apparatus D and acquiring a waveform corresponding to each of the plurality of positions, a step of extracting a waveform corresponding to a specific timing from the waveform corresponding to each of the plurality of positions and generating an image corresponding to the specific timing based on the extracted waveform, and a step of extracting a feature point based on a brightness distribution correlation value in the image corresponding to the specific timing and identifying a position of a drive element in the semiconductor apparatus based on the feature point.

In the semiconductor apparatus examination method according to the present embodiment, the waveform corresponding to each of the plurality of positions is acquired based on light from the plurality of positions of the semiconductor apparatus D, and the image corresponding to the specific timing is generated from a waveform corresponding to the specific timing extracted from each waveform. For example, an image associated with the operation of the drive element is generated by setting the specific timing as a timing related to the operation of the drive element. Then, a position having a high degree of relevance to the specific timing, that is, a position having a high degree of relevance to the operation of the drive element is extracted as a feature point by extracting the feature point in consideration of the brightness distribution correlation value in the image corresponding to the specific timing, and the position of the drive element can be identified with high accuracy based on the feature point. It is possible to perform examination such as a failure analysis in the semiconductor apparatus D with high accuracy by identifying the position of the drive element with high accuracy.

In the step of generating the image, a waveform corresponding to a specific timing related to an operation of the drive element is extracted. Thus, a position having a high degree of relevance to the operation of the drive element can be appropriately extracted as a feature point, and the position of the drive element can be identified with high accuracy.

In the step of generating the image, the waveform corresponding to the specific timing based on the design information of the semiconductor apparatus D is extracted. The operation timing of the drive element is identified by the design information of the semiconductor apparatus D. Therefore, the waveform corresponding to the operation timing of the drive element can be appropriately acquired by extracting the waveform corresponding to the specific timing based on the design information of the semiconductor apparatus D.

In the step of generating the image, a waveform is extracted based on the correlation with the specific timing. For example, a waveform close to the operation timing of the drive element can be appropriately extracted by considering the correlation with the specific timing.

In the step of identifying the position, the center of gravity of the brightness distribution correlation value is detected, and the feature point is extracted based on the center of gravity. The position of the drive element can be identified with high accuracy by extracting the feature point based on the center of gravity of the brightness distribution correlation value.

In the step of identifying the position, fitting is performed on the brightness distribution correlation value, and the feature point is extracted based on the fitting results. For example, the above-described center of gravity can be detected with high accuracy and the position of the drive element can be identified with high accuracy by applying Gaussian fitting or the like to the brightness distribution correlation value.

The above-described semiconductor apparatus examination method further includes a step of generating a light emission integrated image AI (refer to FIG. 6(a)) by integrating the waveforms corresponding to the plurality of positions. A range of the detected light can be confirmed by such a light emission integrated image AI being generated.

The above-described semiconductor apparatus examination method further includes a step of superimposing and displaying the position of the drive element identified in the identifying step on a pattern image showing a pattern of the semiconductor apparatus D. Thus, it is possible to identify which drive element on the pattern image (the layout) has an abnormality.

In the step of acquiring the waveform, light emitted from the drive element is detected as light from the plurality of positions in the semiconductor apparatus D. Thus, it is possible to appropriately examine the light emission of the drive element.

REFERENCE SIGNS LIST

1 Semiconductor apparatus examination apparatus
21 Control apparatus (analysis part)
22 Display part
35 Photodetector
44a, 44b Galvanometer mirror (optical scanning part)
AI Light emission integrated image (measurement image)
D Semiconductor apparatus

The invention claimed is:

1. A semiconductor apparatus examination method comprising:
   detecting light from a plurality of positions in a semiconductor apparatus and acquiring a waveform corresponding to each of the plurality of positions;
   extracting a waveform corresponding to a specific timing from the waveform corresponding to each of the plurality of positions and generating an image corresponding to the specific timing based on the extracted waveform; and
   extracting a feature point based on a brightness distribution correlation value in the image corresponding to the specific timing and identifying a position of a drive element in the semiconductor apparatus based on the feature point.

2. The semiconductor apparatus examination method according to claim 1, wherein, in generating the image, a waveform corresponding to a specific timing related to an operation of the drive element is extracted.

3. The semiconductor apparatus examination method according to claim 2, wherein, in generating the image, a waveform corresponding to a specific timing based on design information of the semiconductor apparatus is extracted.

4. The semiconductor apparatus examination method according to claim 2, wherein, in generating the image, a waveform is extracted based on a correlation with the specific timing.

5. The semiconductor apparatus examination method according to claim 1, wherein, in identifying the position, a center of gravity of the brightness distribution correlation value is detected, and the feature point is extracted based on the center of gravity.

6. The semiconductor apparatus examination method according to claim 1, wherein, in identifying the position, fitting is performed on the brightness distribution correlation value, and the feature point is extracted based on fitting results.

7. The semiconductor apparatus examination method according to claim 1, further comprising generating a measurement image by integrating the waveforms corresponding to the plurality of positions.

8. The semiconductor apparatus examination method according to claim 1, further comprising superimposing and displaying a position of the drive element identified in identifying on a pattern image showing a pattern of the semiconductor apparatus.

9. The semiconductor apparatus examination method according to claim 1, wherein, in acquiring the waveform, light emitted from the drive element is detected as light from the plurality of positions in the semiconductor apparatus.

10. A semiconductor apparatus examination apparatus comprising:
    a photodetector configured to detect light from a plurality of positions in a semiconductor apparatus and to output a detection signal;
    an optical scanner configured to guide light from the plurality of positions to the photodetector; and
    a processor configured to perform acquiring a waveform corresponding to each of the plurality of positions based on the detection signal, extracting a waveform corresponding to a specific timing from the waveform corresponding to each of the plurality of positions and generating an image corresponding to the specific timing based on the extracted waveform, and extracting a feature point based on a brightness distribution correlation value in the image corresponding to the specific timing and identifying a position of a drive element in the semiconductor apparatus based on the feature point.

11. The semiconductor apparatus examination apparatus according to claim 10, wherein the processor extracts a waveform corresponding to a specific timing related to an operation of the drive element.

12. The semiconductor apparatus examination apparatus according to claim 11, wherein the processor extracts a waveform corresponding to a specific timing based on design information of the semiconductor apparatus.

13. The semiconductor apparatus examination apparatus according to claim 11, wherein the processor extracts a waveform based on a correlation with the specific timing.

14. The semiconductor apparatus examination apparatus according to claim 10, wherein the processor detects a center of gravity of the brightness distribution correlation value and extracts the feature point based on the center of gravity.

15. The semiconductor apparatus examination apparatus according to claim 10, wherein the processor performs fitting on the brightness distribution correlation value, and extracts the feature point based on fitting results.

16. The semiconductor apparatus examination apparatus according to claim 10, wherein the processor is configured to further perform generating a measurement image by integrating the waveforms corresponding to the plurality of positions.

17. The semiconductor apparatus examination apparatus according to claim 10, further comprising a display configured to superimpose and display a position of the drive element identified by the processor on a pattern image showing a pattern of the semiconductor apparatus.

18. The semiconductor apparatus examination apparatus according to claim 10, wherein the photodetector detects light emitted from the drive element as light from the plurality of positions in the semiconductor apparatus.

* * * * *